(12) United States Patent
Kim et al.

(10) Patent No.: US 6,979,579 B1
(45) Date of Patent: Dec. 27, 2005

(54) METHODS AND APPARATUS FOR INSPECTING CONTACT OPENINGS IN A PLASMA PROCESSING SYSTEM

(75) Inventors: Jisoo Kim, Pleasanton, CA (US); Sangheon Lee, San Jose, CA (US); Sean Kang, Fremont, CA (US); Binet Worsham, Mountain View, CA (US); Bi-Ming Yen, Fremont, CA (US); Reza Sadjadi, Saratoga, CA (US); Peter K. Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/813,913

(22) Filed: Mar. 30, 2004

(51) Int. Cl.⁷ .......................... H01L 21/66; G01B 21/00
(52) U.S. Cl. ............... 438/14; 156/345.25; 204/298.32
(58) Field of Search .............................. 438/5, 7–9, 14, 438/16, 689, 710, 687; 315/111.21; 204/298.31, 204/298.32; 156/345.24, 345.25, 345.35; 216/59, 60, 67

(56) References Cited

U.S. PATENT DOCUMENTS

| | | | | |
|---|---|---|---|---|
| 4,289,188 A | * | 9/1981 | Mizutani et al. | 156/626 |
| 4,675,072 A | * | 6/1987 | Bennett et al. | 156/626 |
| 4,687,539 A | * | 8/1987 | Burns et al. | 156/626 |
| 5,200,032 A | * | 4/1993 | Shinohara | 156/664 |
| 5,312,515 A | * | 5/1994 | Shinohara | 156/626 |
| 6,136,712 A | * | 10/2000 | Klippert et al. | 438/692 |
| 2001/0023991 A1 | * | 9/2001 | Kakuhara | 257/774 |

FOREIGN PATENT DOCUMENTS

| | | | | |
|---|---|---|---|---|
| JP | 2-172224 | * | 7/1990 | H01L 21/302 |
| JP | 4-106921 | * | 4/1992 | H01L 21/302 |

* cited by examiner

Primary Examiner—Evan Pert
(74) Attorney, Agent, or Firm—IP Strategy Group, PC

(57) ABSTRACT

In a plasma processing system, a method of inspecting a contact opening of a contact formed in a first layer of the substrate to determine whether the contact reaches a metal layer that is disposed below the first layer is shown. The method includes flowing a gas mixture into a plasma reactor of the plasma processing system, the gas mixture comprising a flow of a chlorine containing gas. The method also includes striking a plasma from the gas mixture; and exposing the contact to the plasma. The method further includes detecting whether metal chloride is present in the contact opening after the exposing.

40 Claims, 13 Drawing Sheets

METHODS AND APPARATUS FOR INSPECTING CONTACT OPENINGS IN A PLASMA PROCESSING SYSTEM

BACKGROUND OF THE INVENTION

The present invention relates in general to substrate manufacturing technologies and in particular to methods and apparatus for inspecting contact openings in a plasma processing system.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source then flows into the chamber and is struck to form a plasma to etch exposed areas of the substrate.

Referring now to FIG. 1, a simplified diagram of plasma processing system components is shown. Generally, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116. In addition, liner 117 provides a thermal barrier between the plasma and the plasma processing chamber, as well as helping to optimize plasma 110 on substrate 114.

Gas distribution system 122 is commonly comprised of compressed gas cylinders 124a–f containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a–f may be further protected by an enclosure 128 that provides local exhaust ventilation. Mass flow controllers 126a–f are commonly a self-contained devices (consisting of a transducer, control valve, and control and signal-processing electronics) commonly used in the semiconductor industry to measure and regulate the mass flow of gas to the plasma processing system. Injector 109 introduces plasma processing gases 124 as an aerosol into chamber 102.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a–b is matching network 132 that may be further coupled to RF generator 138. Matching network 132 attempts to match the impedance of RF generator 138, which typically operates at 13.56 MHz and 50 ohms, to that of the plasma 110.

Generally, some type of cooling system is coupled to the chuck in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole or cavity. Generally, an opening is formed in a dielectric layer, usually lined with a TaN or TiN barrier, and then subsequently filled with a set of conductive materials (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of silicon nitride is then deposited to cap the copper.

There are generally three commonly used approaches for manufacturing dual damascene substrates: via-first, trench-first, and self-align. In one example of the via-first methodology, the substrate is first coated with photoresist and then the vias are lithographically patterned. Next, an anisotropic etch cuts through the surface cap material and etches down through the low-k layer of the substrate, and stops on a silicon nitride barrier, just above the underlying metal layer. Next, the via photoresist layer is stripped, and the trench photoresist is applied and lithographically patterned. Typically, some of the photoresist will remain in the bottom of the via, or the via may be covered by an organic ARC plug, in order to prevent the lower portion via from being over-etched during the trench etch process. A second anisotropic etch then cuts through the surface cap material and etches the low-k material down to a desired depth. This etch forms the trench. The photoresist is then stripped and the Silicon Nitride barrier at the bottom of the via is opened with a very soft, low-energy etch that will not cause the underlying copper to sputter into the via. As described above, the trench and via are filled with a conductive material (e.g., aluminum (Al), Copper (Cu), etc.) and polished by chemical mechanical polishing (CMP).

An alternate methodology is trench-first. In one example, the substrate is coated with photoresist and a trench lithographic pattern is applied. An anisotropic dry etch then cuts through the surface hard mask (again typically SiN, TiN or TaN) followed by stripping the photoresist. Another photoresist is applied over the trench hard mask and then the vias are lithographically patterned. A second anisotropic etch then cuts through cap layer and partially etches down into the low-k material. This etch forms the partial vias. The photoresist is then stripped for trench etch over the vias with the hard mask. The trench etch then cuts through the cap layer and partially etches the low-k material down to desired depth. This etch also clears via holes at the same time stopping on the final barrier located at the bottom of the via. The bottom barrier is then opened with a special etch.

A third methodology is self-align. This method combines the oxide etch steps but requires two separate ILD (interlevel dielectric) depositions with an intervening nitride mask and etch step. The lower (via) dielectric is deposited with a nitride etch stop on both top and bottom. The top nitride is masked and etched to form a via hard mask. This requires a special nitride etch process. Then the top (line) dielectric is deposited. Finally, the trench mask is aligned with the via openings that have been etched in the nitride, and both the trench and vias are etched in both layers of oxide with one etch step.

To facilitate discussion, FIG. 2A illustrates an idealized cross-sectional view of the layer stack, representing the layers of an exemplar semiconductor IC, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of the layer stack, there is shown a layer 208, comprising a semiconductor, such as $SiO_2$. Above layer 208 is disposed a barrier layer 204, typically comprising nitride or carbide (SiN or SiC). Dual damascene substrates further comprise a set of metal layers including M1 209a–b, typically comprising aluminum or copper. Above the barrier layer 204, is disposed an intermediate dielectric (IMD) layer 206 (e.g., Coral, etc.), comprising a low-k material (e.g., SiOC, etc.). Above the IMD layer 206, there may be placed a cap layer 203, typically comprising $SiO_2$. Above cap layer 203, there may be disposed a trench mask layer 202, typically comprising TiN, SiN, TaN, or TEOS.

FIG. 2B shows a somewhat idealized cross-sectional view of the layer stack of FIG. 2A, after photoresist layer 220 and a BARC layer 222 is further added.

FIG. 2C shows a somewhat idealized cross-sectional view of the layer stack of FIG. 2B after photoresist layer 220 and BARC layer 222 have been processed through lithography. In this example, a photoresist mask pattern is created with a set of trenches 214a–b.

FIG. 2D shows the cross-sectional view of the layer stack of FIG. 2C after trench mask layer 202 has been processed in the plasma system, further extending trench 214a–b to cap layer 203.

FIG. 2E shows the cross-sectional view of the layer stack of FIG. 2D, after photoresist layer 220 and a BARC layer 212 are removed.

FIG. 2F shows the cross-sectional view of the layer stack of FIG. 2E after a second photoresist layer 216 and a BARC layer 218 are disposed, in order to create a second metal layer and a via connecting it to the first metal layer 209a–b.

FIG. 2G shows the cross-sectional view of the layer stack of FIG. 2F after the photoresist layer has been opened and an etch has been performed to partially etch into IMD layer 206 to create a via.

FIG. 2H shows the cross-sectional view of the layer stack of FIG. 2G after photoresist layer 216 and BARC layer 218 have been stripped, and an additional etch process has been performed to extend the trench to a desired depth and etch through a via stopping on barrier layer 204.

In FIG. 2I, the barrier layer 204 is etched through using, for example $CH_2F_2$, $CH_3F$, etc.

In FIG. 2J, a chemical mechanical polish process has been performed to polish the layer stack down to cap layer 203, and a conductive material (e.g., aluminum (Al), Copper (Cu), etc.) has been deposited to contact the existing M1 metal material.

However, escalating requirements for high circuit density on substrates may be difficult to satisfy using current plasma processing technologies where sub-micron via contacts and trenches have high aspect ratios. In particular, it is difficult to determine if any given contact or trench has been sufficiently etched in order to make a substantial electrical connection with the underlying layer. Referring now to FIG. 3A, the cross-sectional view of a layer stack, as shown in FIG. 2, in which fencing 302 has occurred. Referring now to FIG. 3B, the cross-sectional view of a layer stack, as shown in FIG. 2, in which corner erosion 304 has occurred. Referring now to FIG. 3C, the cross-sectional view of a layer stack, as shown in FIG. 2, in which a partially etched contact or trench 306 has occurred.

For example, it may be particularly challenging to determine whether an isolated contact hole (e.g., Kelvin via, etc.) is well landed on the metal surface after dry etching. One method involves charging the contact array using a Scanning Electron Microscope (SEM) or other suitable microscope, and then comparing the contrast difference between each contact.

SEM generally involves focusing a beam of rastered electrons across a sample surface (e.g., substrate, etc.) that may be synchronous with a cathode ray tube (CRT). The brightness of the CRT is modulated by the detected secondary electron current from the sample, such that the viewing CRT displays an image of the variation of secondary electron intensity with position on the sample. This variation is largely dependent on the angle of incidence of the focused beam onto the sample, thus yielding a topographical image. By comparing the contrast among sets of contacts and trenches, problematic areas can be determined. For example, when compared to sets of contracts with a high contrast, other proximately located contacts with low contrast may have potential landing issues (i.e., substantial electrical contact with the lower surface, etc.). However, in very high aspect ratio contacts, a SEM may have a low sensitivity to landing issues because the secondary electrons may be trapped within the via or trench cavity. Furthermore, this method may become even less effective when observing isolated contacts (contacts without proximately located neighbors).

Another technique involves depositing a metal using metal deposition techniques (e.g., plasma vapor deposition (PVD), Ionized Metal Plasma (IMP), etc.) on an isolated contact, and then subsequently the contact with an appropriate cutting technique (e.g., focused ion beam, etc.) in order to see the image. However, high aspect ratio contacts may be difficult to substantially fill using metal deposition. Furthermore, any observed image may be susceptible to the cutting angle of the cutting techniques. In addition, cutting techniques also tend to be expensive to conduct, and hence may only be done intermittently.

In view of the foregoing, there are desired methods and apparatus for inspecting contact openings in a plasma processing system.

SUMMARY OF THE INVENTION

The invention relates, in one embodiment, in a plasma processing system, to a method of inspecting a contact opening of a contact formed in a first layer of the substrate to determine whether the contact opening reaches a metal layer that is disposed below the first layer. The method includes flowing a gas mixture into a plasma reactor of the plasma processing system, the gas mixture comprising a flow of a chlorine containing gas. The method also includes striking a plasma from the gas mixture; and exposing the contact to the plasma. The method further includes detecting whether metal chloride is present in the contact opening after the exposing.

The invention relates, in one embodiment, in a plasma processing system, to an apparatus for inspecting a contact opening of a contact formed in a first layer of the substrate to determine whether the contact opening reaches a metal layer that is disposed below the first layer. The apparatus includes a means of flowing a gas mixture into a plasma reactor of the plasma processing system, the gas mixture comprising a flow of a chlorine containing gas. The apparatus also includes a means of striking a plasma from the gas mixture; and a means of exposing the contact to the plasma. The apparatus further includes a means of detecting whether metal chloride is present in the contact opening after the exposing.

These and other features of the present invention will be described in more detail the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
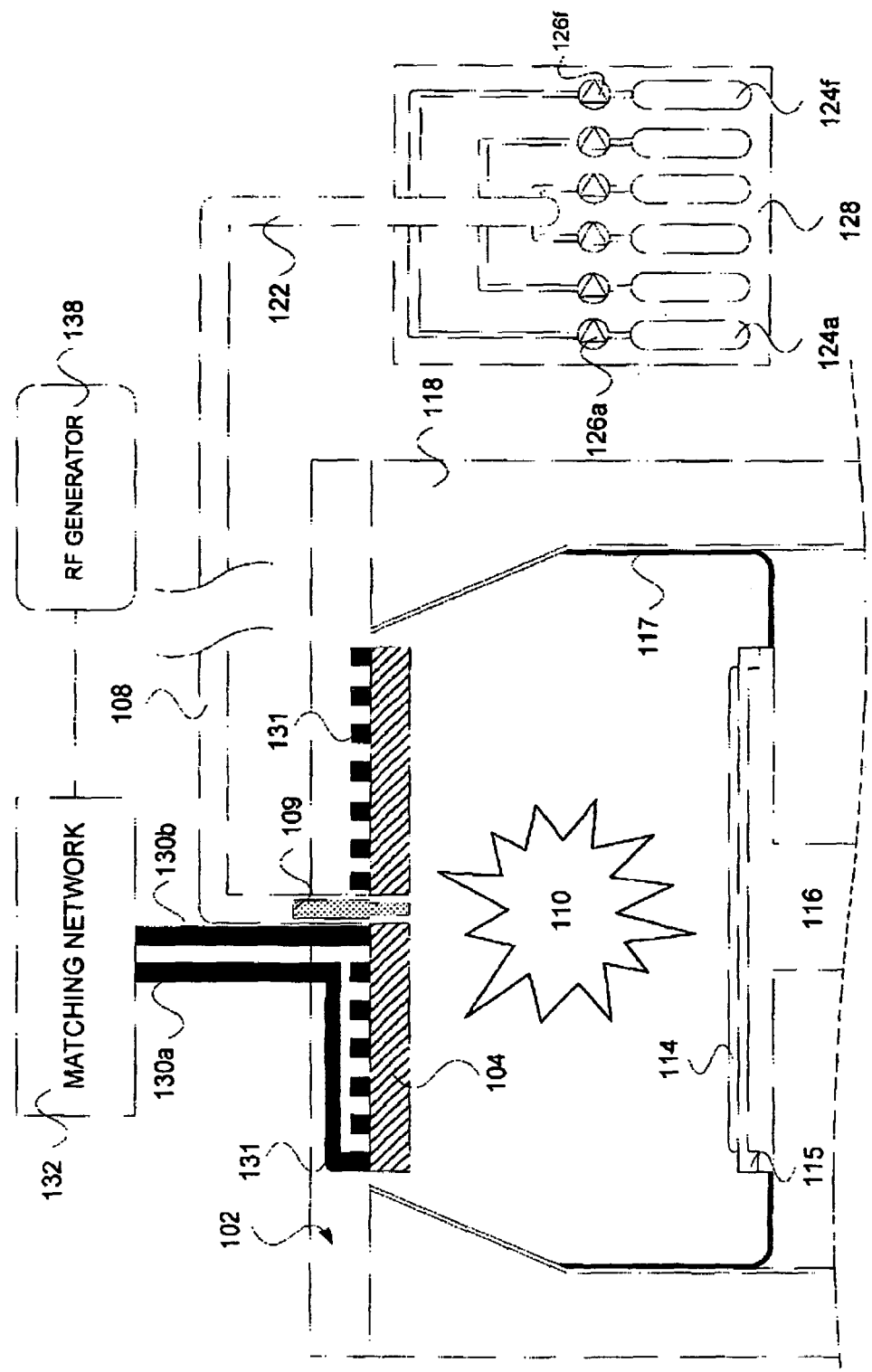
FIG. 1 illustrates a simplified diagram of plasma processing system components.
Figure 2A:
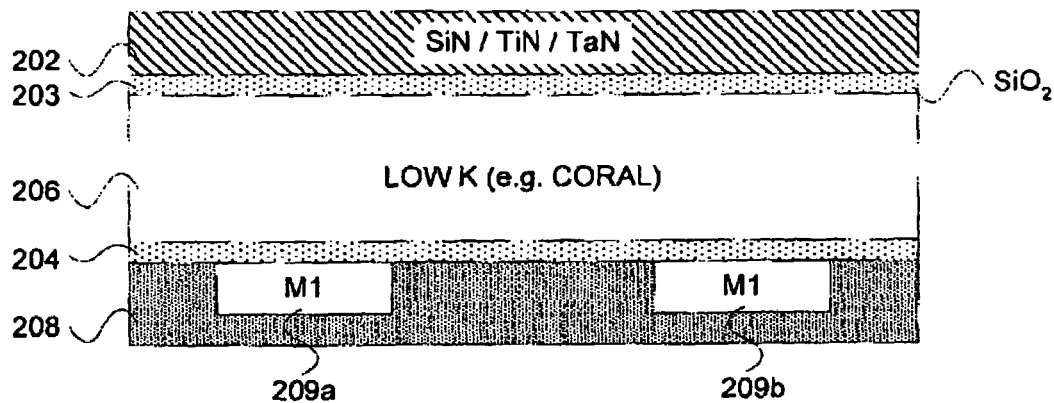
FIG. 2A illustrates an idealized cross-sectional view of a layer stack, representing the layers of an exemplar semiconductor IC, prior to a lithographic step.
Figure 2B:
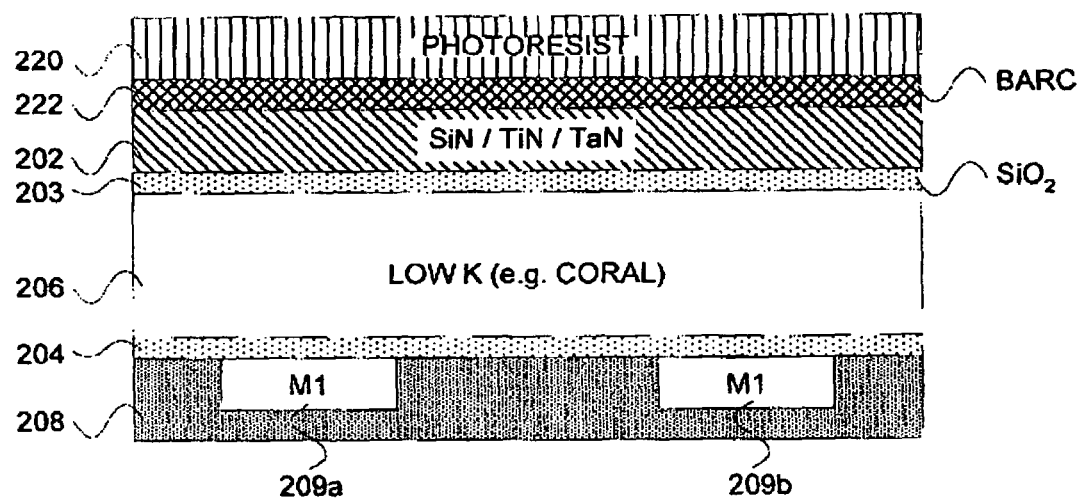
FIG. 2B shows a somewhat idealized cross-sectional view of the layer stack of FIG. 2A, after a first photoresist layer and a first BARC layer are added.
Figure 2C:
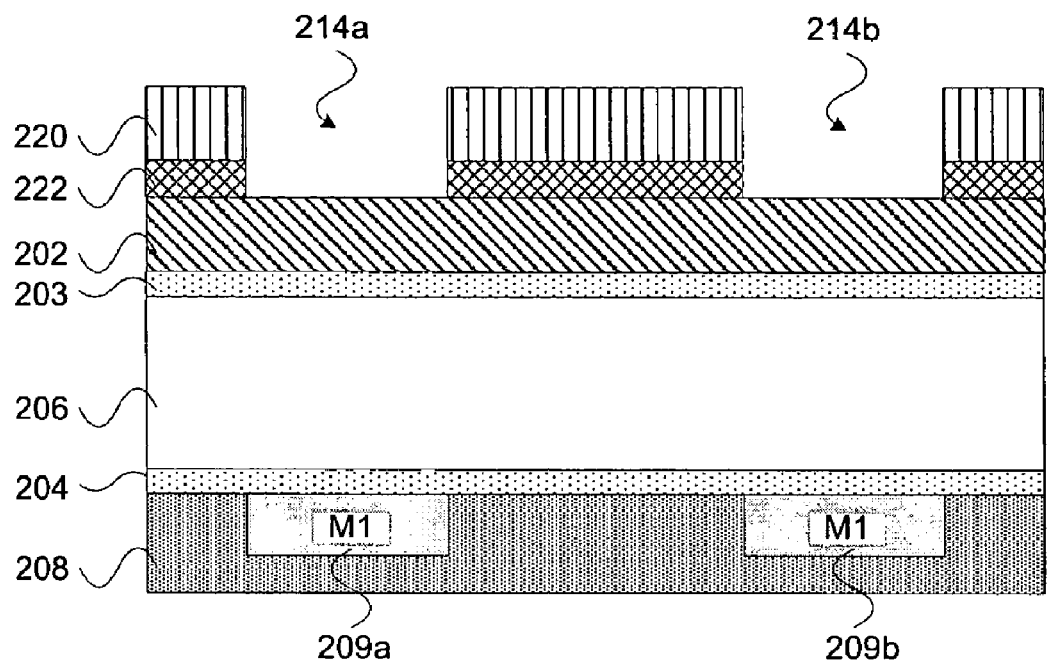
FIG. 2C shows a somewhat idealized cross-sectional view of the layer stack of FIG. 2B after the first photoresist layer and the first BARC layer have been processed through lithography.
Figure 2D:
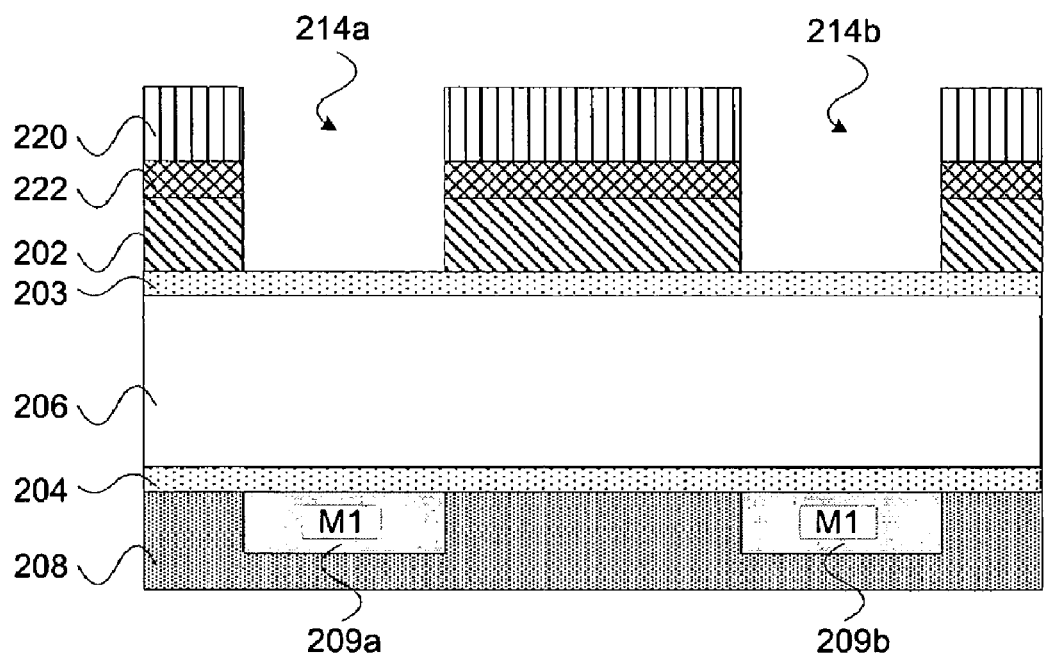
FIG. 2D shows the cross-sectional view of the layer stack of FIG. 2C after a trench mask layer has been processed.
Figure 2E:
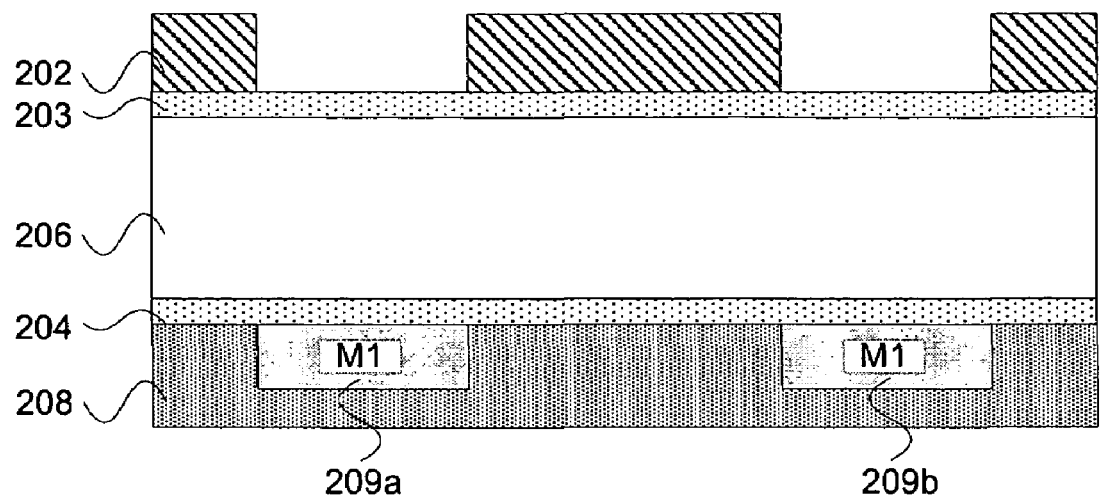
FIG. 2E shows the cross-sectional view of the layer stack of FIG. 2D, after the first photoresist layer and the first BARC layer are removed.
Figure 2F:
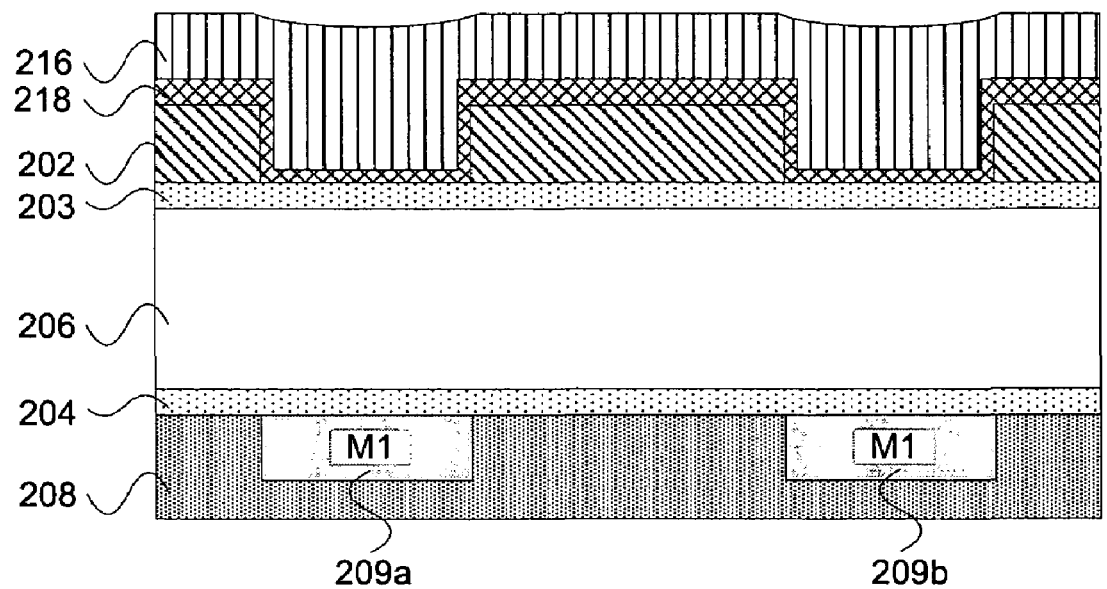
FIG. 2F shows the cross-sectional view of the layer stack of FIG. 2E after a second photoresist layer and a second BARC layer are disposed.
Figure 2G:
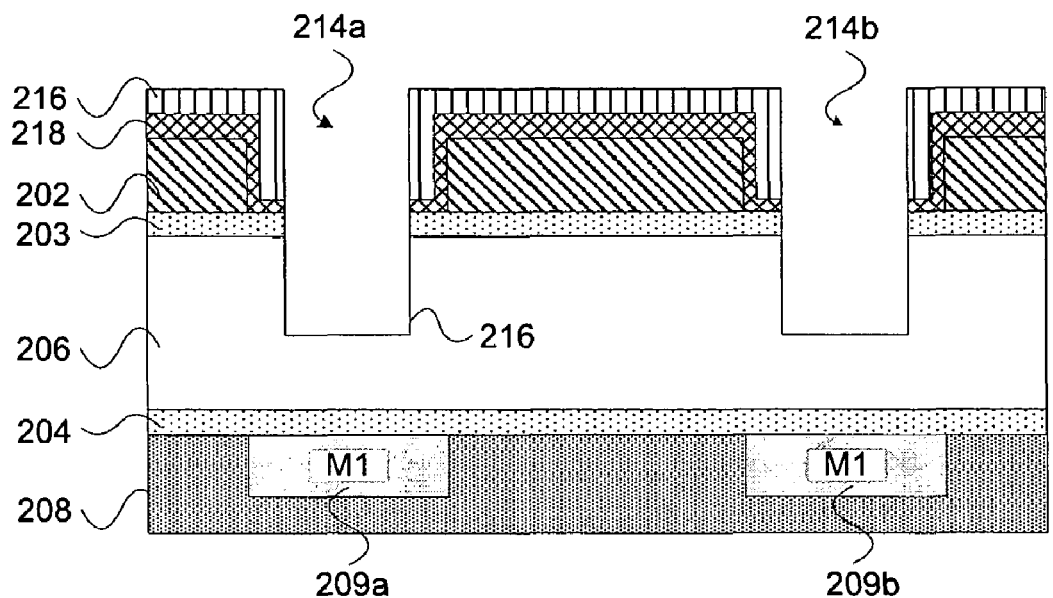
FIG. 2G shows the cross-sectional view of the layer stack of FIG. 2F after the second photoresist layer has been opened and an etch has been performed to partially etch into the IMD layer to create a via.
Figure 2H:
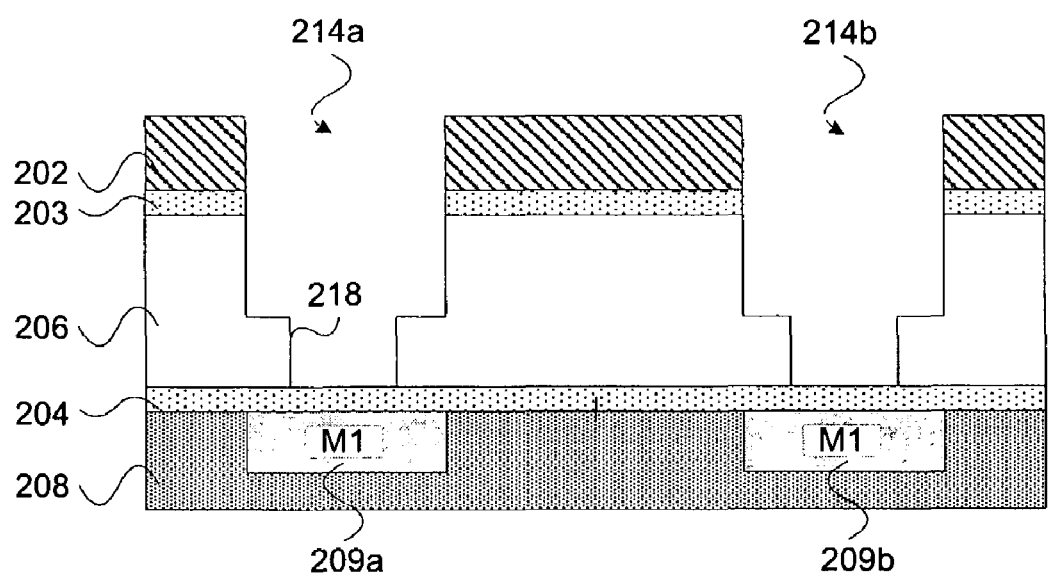
FIG. 2H shows the cross-sectional view of the layer stack of FIG. 2G after the second photoresist layer and second BARC layer have been stripped.
Figure 2I:
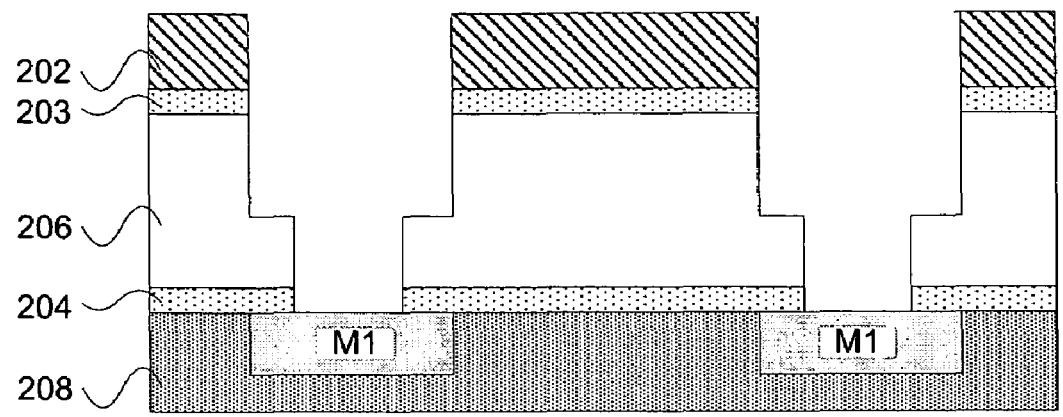
FIG. 2I shows the cross-sectional view of the layer stack of FIG. 2H in which a barrier layer is etched.
Figure 2J:
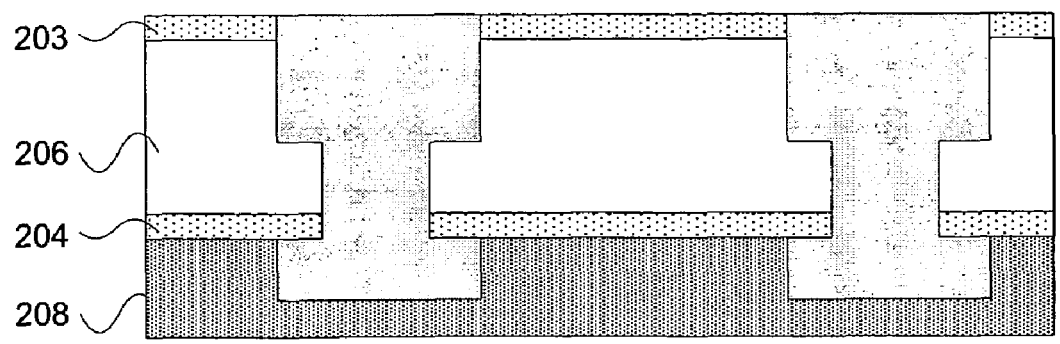
FIG. 2J shows the cross-sectional view of the layer stack of FIG. 2H in which a chemical mechanical polish process has been performed to polish the layer stack down to a cap layer.
Figure 3A:
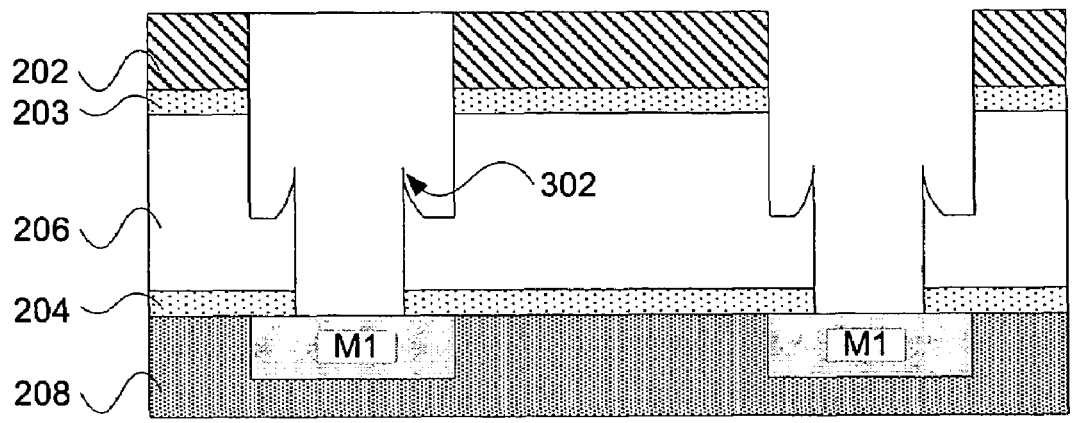
FIG. 3A shows the a cross-sectional view of a layer stack in which fencing has occurred.
Figure 3B:
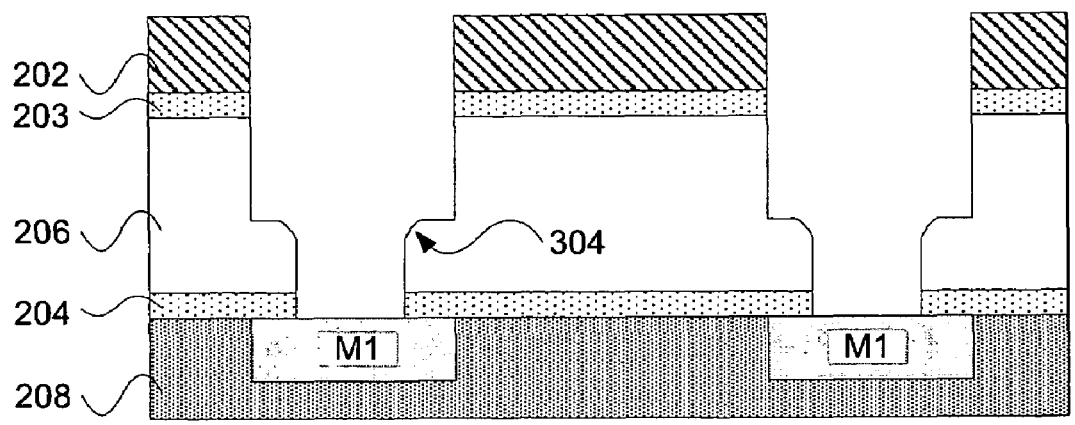
FIG. 3B shows the a cross-sectional view of a layer stack in which corner erosion has occurred.
Figure 3C:
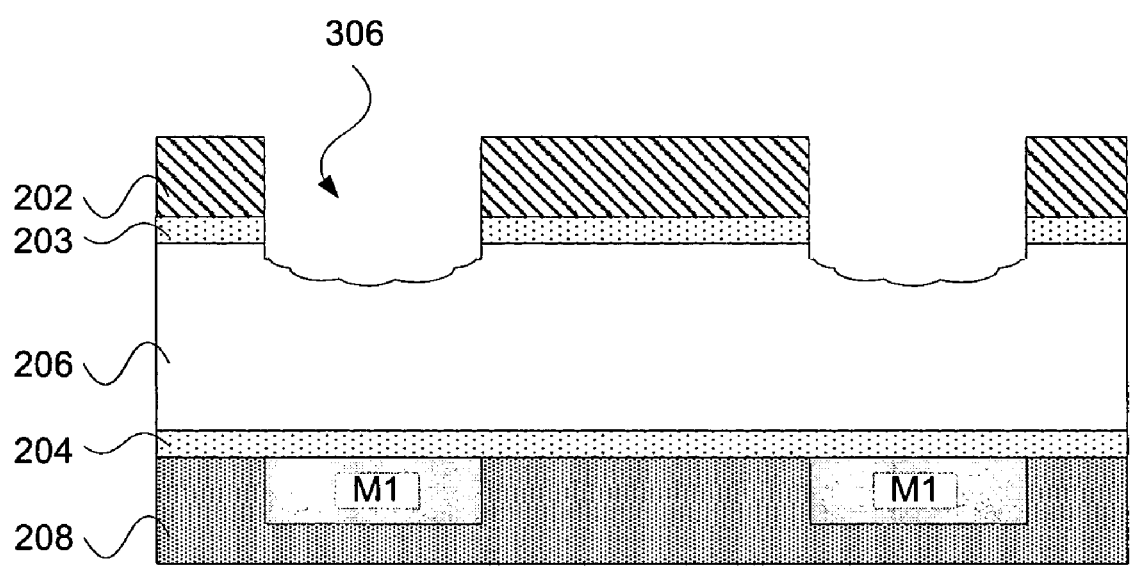
FIG. 3C shows a cross-sectional view of a layer stack in which a partially etched contact or trench 306 has occurred.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that the exposure of a metal to a chlorine containing gas (e.g., $Cl_2$, etc.) may generate a substantial volume metal chloride in comparison to the amount of metal exposed. Generally, a reactive species may be created by dissociating chlorine gas in a plasma processing system. The chlorine species then reacts with exposed metal surface atoms forming a metal chloride reaction product.

In one embodiment, the chlorine containing gas comprises $Cl_2$. In another embodiment, the chlorine containing gas comprises $BCl_3$. In another embodiment, the chlorine containing gas comprises $CH_3Cl$. In another embodiment, the chlorine containing gas comprises $CHF_2Cl$. In another embodiment, the chlorine containing gas comprises HCl. In another embodiment, the chlorine containing gas comprises HBr. In another embodiment, the chlorine containing gas comprises $Br_2$. In another embodiment, the chlorine containing gas comprises $CuCl_2$. In another embodiment, the chlorine containing gas comprises $Cu_xCl_y$, where x and y are integers. In another embodiment, the chlorine containing gas comprises Ar, in order to help sustain the plasma.

In another embodiment, a bias power setting of 2 MHz is preferred. In another embodiment, an RF power setting of 27 MHz is preferred. In another embodiment, an RF power setting of 60 MHz is preferred. In another embodiment, a 10 sec exposure to the chlorine containing gas is preferred. In another embodiment, the chlorine containing gas is about 1% and about 100% of a total flow of the plasma gas mixture. For example, the chlorine containing gas flow can be between about 1 SCCM $Cl_2$ (standard cubic centimeters/per minute) and about 99 SCCM Ar, and about 100 SCCM $Cl_2$ and about 0 SCCM Ar.

In another embodiment, the chlorine containing gas is more preferably about 10% and about 80% of a total flow of the plasma gas mixture. For example, the chlorine containing gas flow can be between about 10 SCCM $Cl_2$ and about 90 SCCM Ar, and about 80 SCCM $Cl_2$ and about 20 SCCM Ar.

In another embodiment, the chlorine containing gas is most preferably about 50% of a total flow of the plasma gas mixture. For example, the chlorine containing gas flow can be between about 50 SCCM $Cl_2$ and about 50 SCCM Ar.

For example, in a substrate manufactured with a dual damascene comprising a copper metal, exposure to $Cl_2$ may produce a volume of copper chloride (CuClx) which may substantially expand (from about 6 to about 10 times the volume of exposed metal) in order to substantially fill the contact hole or trench. Subsequently, generated metal chloride exposed on the surface of the substrate may then be readily observed with a top down SEM.

In a non-obvious fashion, metal surface atoms on the substrate in a plasma processing system may be exposed to a chlorine containing gas. Subsequently, a metal chloride may be formed that substantially swells. It is believed by the inventor that this volume expansion is caused because of the inclusion of chlorine species in the porous metal. For example, an exposed area of copper may swell six to ten times its original size after the chlorination process.

Figure 4A:
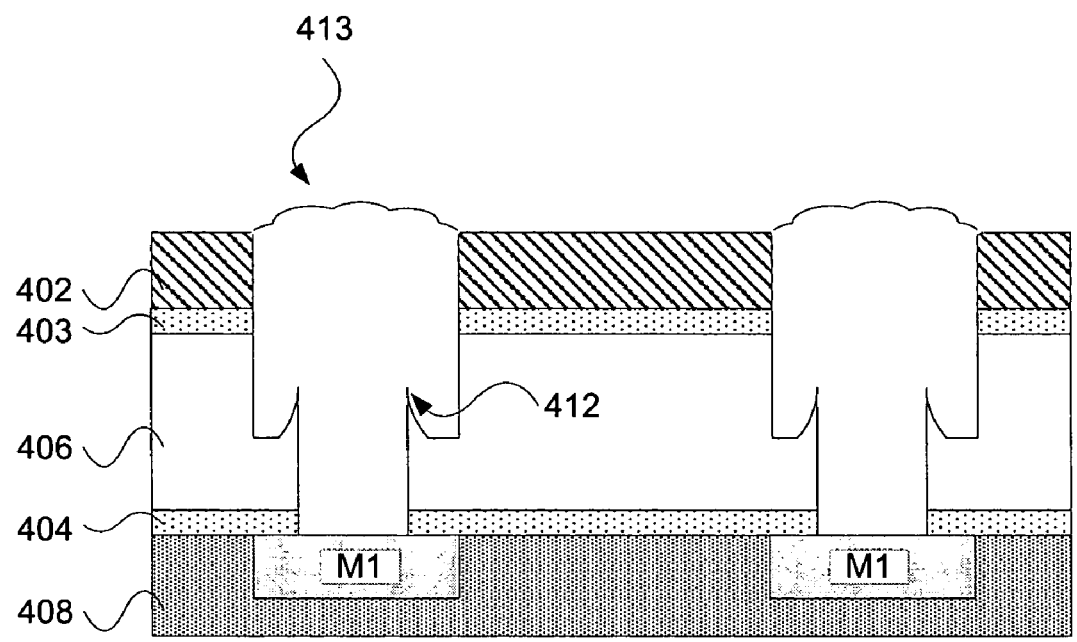
FIGS. 4A–C show a simplified set of layer stacks, representing the layers of an exemplar semiconductor IC that have been exposed to a chlorine containing gas, according to one embodiment of the invention.
Figure 4B:
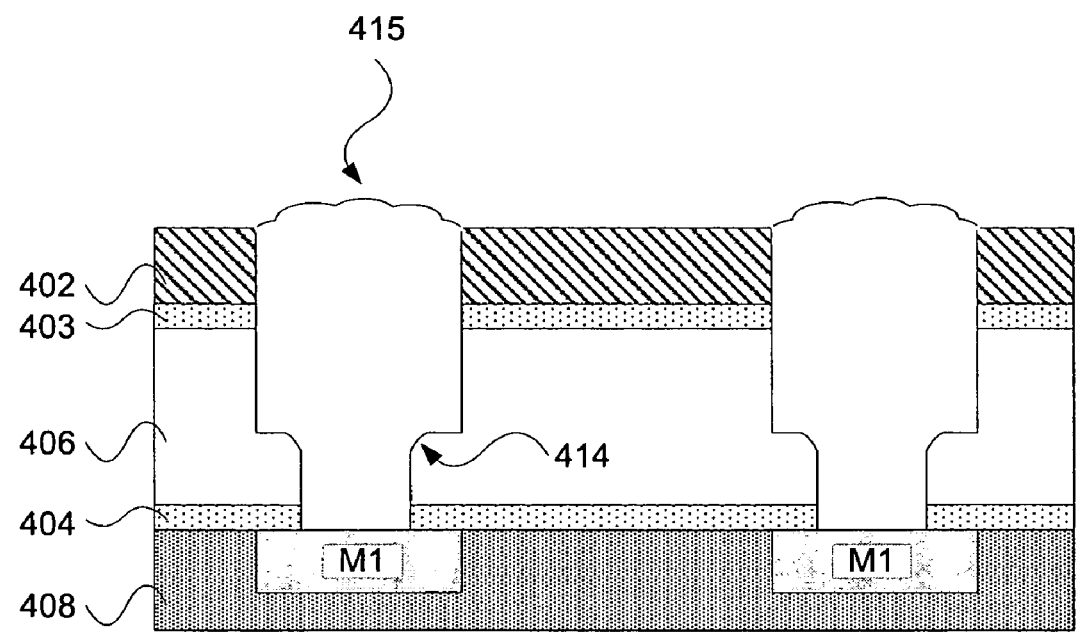
Figure 4C:
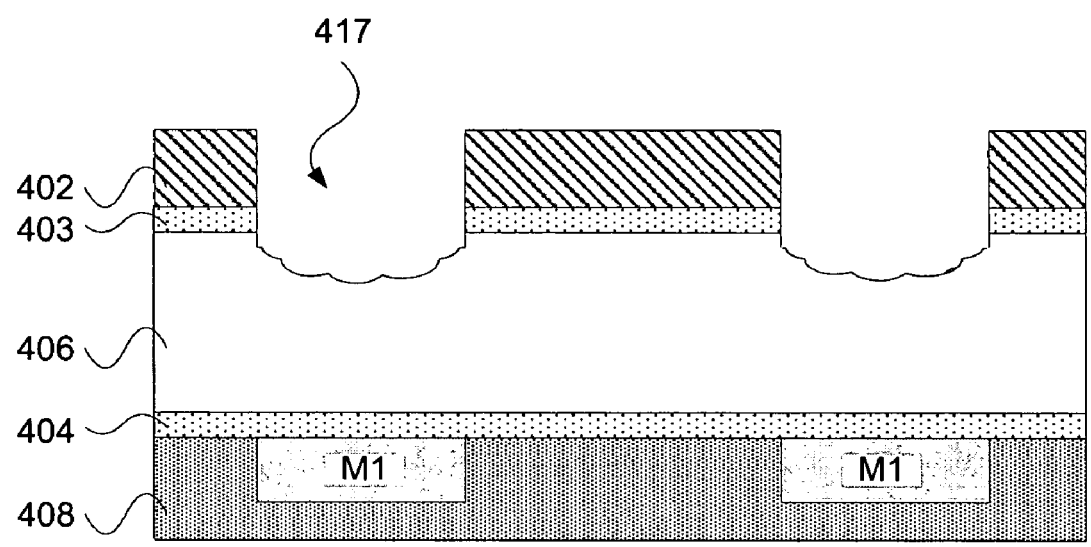

FIGS. 4A–C show a simplified set of layer stacks, representing the layers of an exemplar semiconductor IC that have been exposed to a chlorine containing gas, according to one embodiment of the invention. At the bottom of the layer stack, there is shown a layer 408, comprising a semiconductor, such as $SiO_2$. Above layer 408 is disposed a barrier layer 404, typically comprising nitride or carbide (SiN or SiC). Dual damascene substrates further comprise a set of metal layers including M1, typically comprising aluminum or copper. Above the barrier layer 404, is disposed a intermediate dielectric (IMD) layer 406, comprising a low-k material (e.g., SiOC, etc.). Above the IMD layer 406, there may be placed a cap layer 403, typically comprising $SiO_2$. Above cap layer 403, there may be disposed a trench mask layer 402, typically comprising TiN, SiN, or TaN.

Referring now to FIG. 4A, a simplified layer stack in which fencing 412 has occurred. Upon exposure to a substantial amount of chlorine containing gas, a metal chloride 413 may be formed that may be readily observed with a top down SEM.

Referring now to FIG. 4B, a simplified layer stack in which corner erosion 414 has occurred. Upon exposure to a substantial amount of chlorine containing gas, a metal chloride 415 may be formed that may be readily observed with a top down SEM.

Referring now to FIG. 4C, a simplified layer stack in which contact 417 has only been partially etched. Unlike FIGS. 4A–B, exposure to chlorine containing gas may not produce a metal chloride that may be readily observed with a top down SEM.

Figure 5:
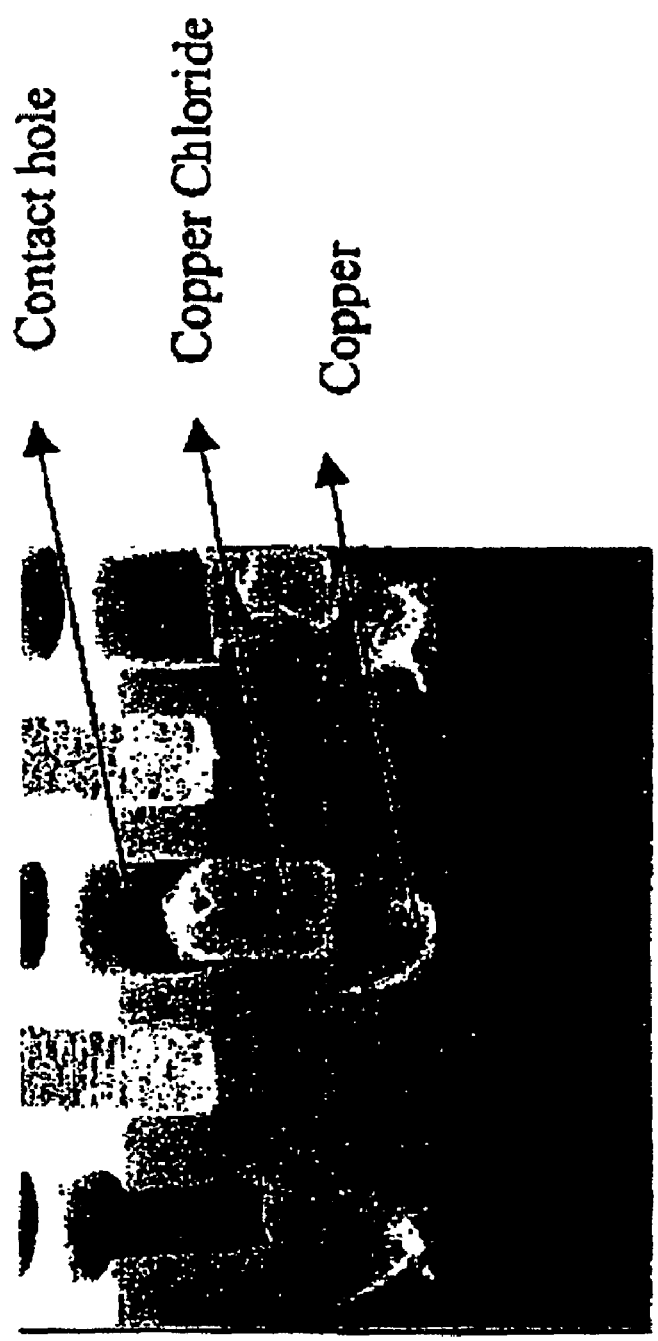
FIG. 5 shows a simplified top-down SEM diagram of a copper chloride formation on an isolated contact, after exposure to $Cl_2$, according to one embodiment of the invention.

Referring now to FIG. 5, a simplified top-down SEM diagram is shown of a copper chloride formation on an isolated contact, after exposure to $Cl_2$, according to one embodiment of the invention.

Figure 6:
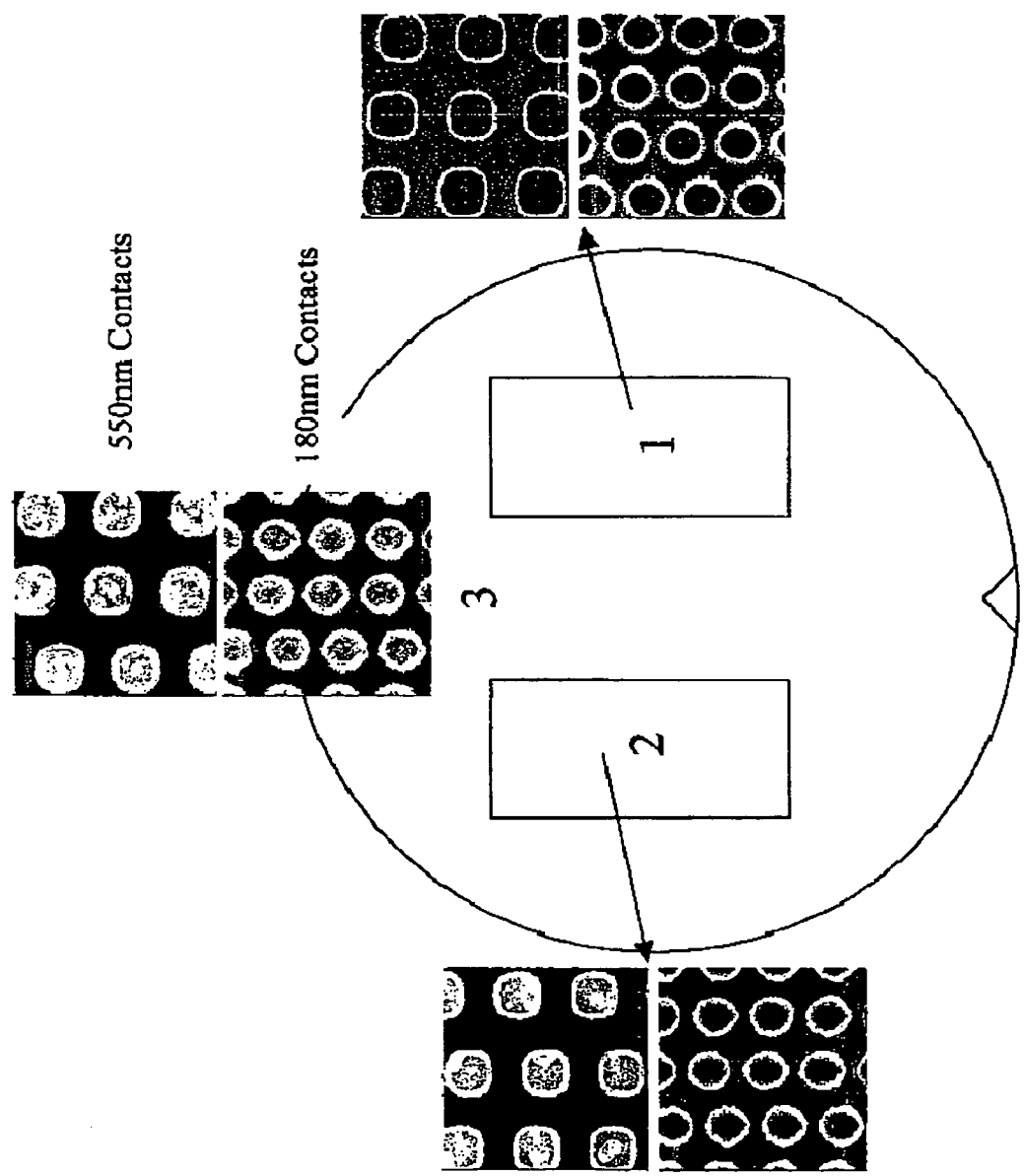
FIG. 6 shows a simplified diagram of a substrate that has been exposed to a chlorine containing gas in a plasma processing system, in which a set of areas in various stages of a dual damascene etch process is described, according to one embodiment of the invention.

Referring not to FIG. 6, a simplified diagram of a substrate that has been exposed to a chlorine containing gas in an Lam Research Exelan HPT (e.g., HP, DFC, etc) plasma processing system, in which a set of areas in various stages of a dual damascene etch process is shown, according to one embodiment of the invention. Operating parameters of the plasma processing system where about: 70 mT, 27 MHz at 300 W, 2 MHz at 0 W, 100 SCCM $Cl_2$, 100 SCCM Ar, a lower electrode temperature of 20° C., and back side Helium at 15 T, for 10 sec.

In the area 1, the dual damascene manufacturing method has progressed to a stage in which at which the TEOS layer has been substantially etched. Since un-etched layers of Coral and SiC shield may provide shielding to the copper layer, there may be no substantial volume of copper chloride (e.g., CuClx) produced.

In area 2, the dual damascene manufacturing method has progressed to a stage in which the Coral layer has been etched. Since an un-etched layer of SiC may be still present above the copper layer in the case of higher aspect ratio contacts (e.g., smaller contact size), only lower aspect ratio contacts (e.g., larger contact size) may produce copper chloride (e.g., CuClx) while higher aspect ratio contacts may not.

In area 3, the dual damascene manufacturing method has progressed to a stage in which at which the SiC layer has been etched, exposing the copper to the chlorine containing gas, and producing a substantial amount of copper chloride (e.g., CuClx).

Figure 7:
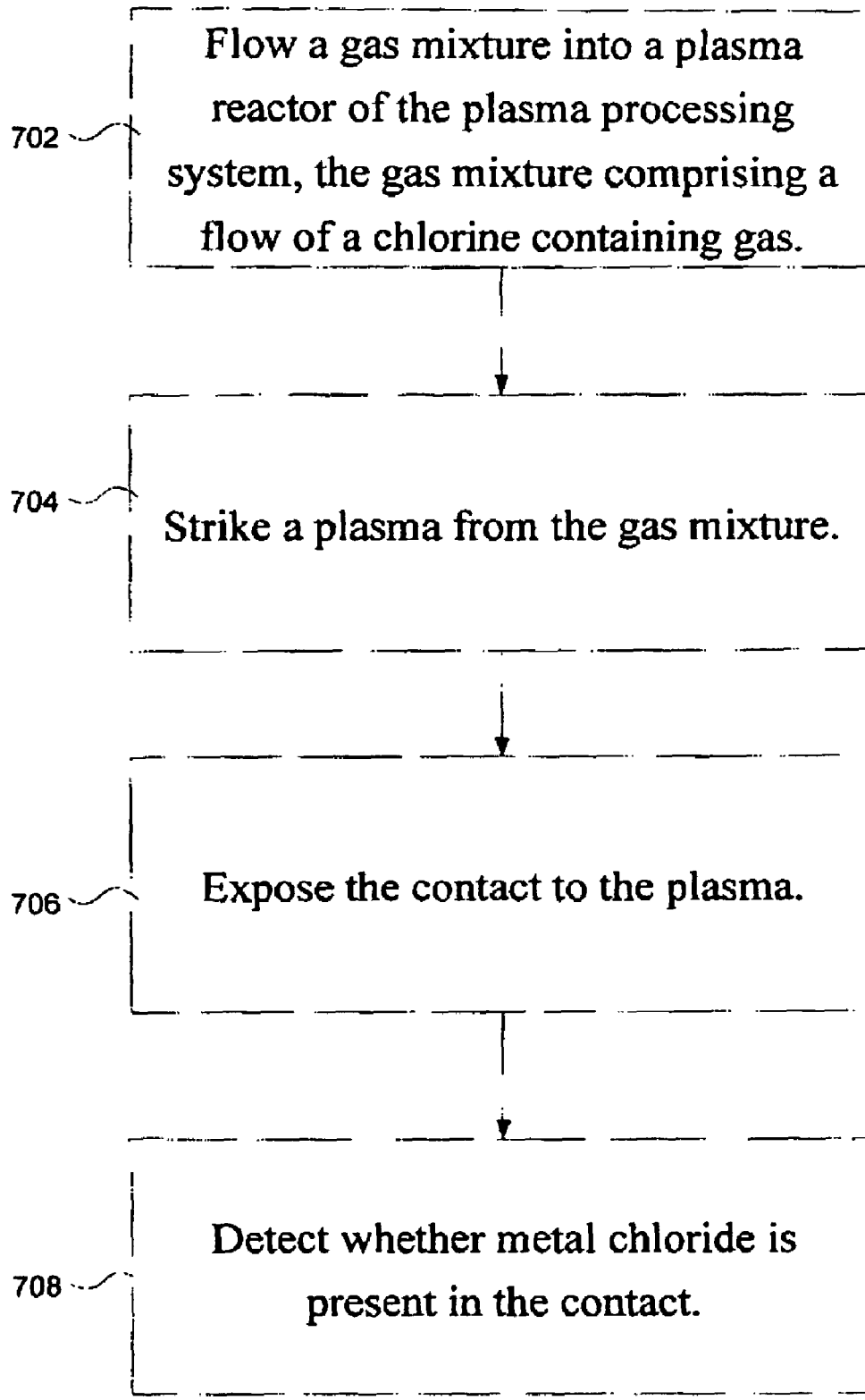
FIG. 7 shows a simplified method for inspecting a contact opening of a contact formed in a first layer of said substrate to determine whether said contact reaches a metal layer that is disposed below said first layer, according to one embodiment of the invention.

Referring not to FIG. 7, a simplified method is shown for inspecting a contact formed in a first layer of said substrate to determine whether said contact reaches a metal layer that is disposed below said first layer, according to one embodiment of the invention. Initially, a gas mixture is flowed into a plasma reactor of the plasma processing system, the gas mixture comprising a flow of a chlorine containing gas, at step 702. A plasma is then struck from the gas mixture, at step 704. The contact is then exposed to the plasma, at step 706. And finally, the presence of metal chloride is then detected in the contact, at step 708.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, plasma etchants comprising gases other than chlorine may be used. It should also be noted that there are many alternative ways of implementing the methods of the present invention.

Advantages of the invention include methods and apparatus for inspecting contact openings in a plasma processing system. Additional advantages include minimizing manufacturing yield problems, as well as optimizing plasma processing throughput.

Having disclosed exemplary embodiments and the best mode, modifications and variations may be made to the disclosed embodiments while remaining within the subject and spirit of the invention as defined by the following claims.

What is claimed is:

1. In a plasma processing system, a method of inspecting a contact opening of a contact formed in a first layer of said substrate to determine whether said contact opening reaches a metal layer that is disposed below said first layer comprising:

flowing a gas mixture into a plasma reactor of said plasma processing system, said gas mixture comprising a flow of a chlorine containing gas;

striking a plasma from said gas mixture;

exposing said contact to said plasma; and detecting whether metal chloride is present in said contact opening after said exposing.

2. The method of claim 1, wherein said detecting includes observing said metal chloride using a microscope.

3. The method of claim 1, wherein said detecting includes observing said metal chloride using a top down SEM technique.

4. The method of claim 1, wherein said chlorine containing gas is $Cl_2$.

5. The method of claim 1, wherein said chlorine containing gas is $BCl_3$.

6. The method of claim 1, wherein said chlorine containing gas is $CH_3Cl$.

7. The method of claim 1, wherein said chlorine containing gas is $CHF_2Cl$.

8. The method of claim 1, wherein said chlorine containing gas is HCl.

9. The method of claim 1, wherein said chlorine containing gas is HBr.

10. The method of claim 1, wherein said chlorine containing gas is $Br_2$.

11. The method of claim 1, wherein said chlorine containing gas is $CuCl_2$.

12. The method of claim 1, wherein said chlorine containing gas is $Cu_xCl_y$, where x and y are integers.

13. The method of claim 1, wherein said set of metals comprises essentially of Cu.

14. The method of claim 1, wherein said set of metals comprise essentially of Al.

15. The method of claim 1, wherein said flow of a chlorine containing gas is more preferably between about 1% and about 100% of a total flow of said gas mixture.

16. The method of claim 1, wherein said flow of a chlorine containing gas is more preferably between about 10% and about 80% of a total flow of said gas mixture.

17. The method of claim 1, wherein said flow of a chlorine containing gas is most preferably about 50% of a total flow of said gas mixture.

18. The method of claim 1, wherein said plasma processing system employs a bias power setting of about 2 MHz.

19. The method of claim 1, wherein said plasma processing system employs a RF power setting of about 27 MHz.

20. The method of claim 1, wherein said plasma processing system employs a RF power setting of about 60 MHz.

21. In a plasma processing system, an apparatus for inspecting a contact opening of a contact formed in a first layer of said substrate to determine whether said contact opening reaches a metal layer that is disposed below said first layer comprising:

a means of flowing a gas mixture into a plasma reactor of said plasma processing system, said gas mixture comprising a flow of a chlorine containing gas;

a means of striking a plasma from said gas mixture;

a means of exposing said contact to said plasma; and a means of detecting whether metal chloride is present in said contact after said exposing.

22. The apparatus of claim 21, wherein said detecting includes observing said metal chloride using a microscope.

23. The apparatus of claim 21, wherein said detecting includes observing said metal chloride using a top down SEM technique.

24. The apparatus of claim 21, wherein said chlorine containing gas is $Cl_2$.

25. The apparatus of claim 21, wherein said chlorine containing gas is $BCl_3$.

26. The apparatus of claim 21, wherein said chlorine containing gas is $CH_3Cl$.

27. The apparatus of claim 21, wherein said chlorine containing gas is $CHF_2Cl$.

28. The apparatus of claim 21, wherein said chlorine containing gas is HCl.

29. The apparatus of claim 21, wherein said chlorine containing gas is HBr.

30. The apparatus of claim 21, wherein said chlorine containing gas is $Br_2$.

31. The apparatus of claim 21, wherein said chlorine containing gas is $CuCl_2$.

32. The apparatus of claim 21, wherein said chlorine containing gas is $Cu_xCl_y$, where x and y are integers.

33. The apparatus of claim 21, wherein said set of metals comprises essentially of Cu.

34. The apparatus of claim 21, wherein said set of metals comprise essentially of Al.

35. The apparatus of claim 21, wherein said flow of a chlorine containing gas is more preferably between about 1% and about 100% of a total flow of said gas mixture.

36. The apparatus of claim 21, wherein said flow of a chlorine containing gas is more preferably between about 10% and about 80% of a total flow of said gas mixture.

37. The apparatus of claim 21, wherein said flow of a chlorine containing gas is most preferably about 50% of a total flow of said gas mixture.

38. The apparatus of claim 21, wherein said plasma processing system employs a bias power setting of about 2 MHz.

39. The apparatus of claim 21, wherein said plasma processing system employs a RF power setting of about 27 MHz.

40. The apparatus of claim 21, wherein said plasma processing system employs a RF power setting of about 60 MHz.

* * * * *